US010608598B2

(12) United States Patent
Wang et al.

(10) Patent No.: US 10,608,598 B2
(45) Date of Patent: Mar. 31, 2020

(54) AMPLIFICATION IN PRESENCE OF A VARIABLE ANTENNA IMPEDANCE

(71) Applicant: Qualcomm Technologies, Inc., San Diego, CA (US)

(72) Inventors: Chuan Wang, San Diego, CA (US); Li Liu, San Diego, CA (US); Kevin Hsi Huai Wang, San Diego, CA (US); Bhushan Shanti Asuri, San Diego, CA (US); Gurkanwal Sahota, San Diego, CA (US); Francesco Carrara, San Diego, CA (US)

(73) Assignee: QUALCOMM Technologies, Inc., San Diego, CA (US)

( * ) Notice: Subject to any disclaimer, the term of this patent is extended or adjusted under 35 U.S.C. 154(b) by 0 days.

(21) Appl. No.: 16/021,762

(22) Filed: Jun. 28, 2018

(65) Prior Publication Data
US 2020/0007092 A1    Jan. 2, 2020

(51) Int. Cl.
*H01Q 1/00* (2006.01)
*H03F 1/56* (2006.01)
(Continued)

(52) U.S. Cl.
CPC ............... *H03F 1/565* (2013.01); *H01P 5/18* (2013.01); *H01Q 23/00* (2013.01); *H03F 3/19* (2013.01);
(Continued)

(58) Field of Classification Search
CPC . H03F 1/565; H03F 3/19; H03F 3/245; H03F 2200/336; H03F 2200/255; H01P 5/18; H01Q 23/00
(Continued)

(56) References Cited

U.S. PATENT DOCUMENTS 6,181,208 B1 * 1/2001 King .................... H03F 3/72
                                                     330/124 R
7,256,650 B1 * 8/2007 Stockert ............. H03F 1/0216
                                                     330/124 R
(Continued)

OTHER PUBLICATIONS

Carrara, "Circuits for Current Sensing in RF Power Amplifiers (IDF #52530)", Apr. 23, 2015, 18 pages.
(Continued)

*Primary Examiner* — Jean B Jeanglaude
(74) *Attorney, Agent, or Firm* — Colby Nipper

(57) ABSTRACT

In an example aspect, an apparatus includes a balanced power amplifier, which performs amplification in the presence of a variable antenna impedance. The balanced power amplifier includes a quadrature output power combiner coupled to a first power amplifying path and a second power amplifying path, detection circuitry, and control circuitry. The detection circuitry includes at least one power detector coupled to an isolated port of the quadrature output power combiner and a resistor coupled between the isolated port and a ground. The at least one power detector is configured to measure power at the isolated port, which is based on a resistance of the resistor. The control circuitry is configured to adjust operating conditions of a first power amplifier of the first power amplifying path and the second power amplifier of the second power amplifying path based on the power that is measured at the isolated port.

30 Claims, 9 Drawing Sheets

(51) Int. Cl.
  H03F 3/24    (2006.01)
  H03F 3/19    (2006.01)
  H01Q 23/00   (2006.01)
  H01P 5/18    (2006.01)

(52) U.S. Cl.
  CPC ....... H03F 3/245 (2013.01); *H03F 2200/255* (2013.01); *H03F 2200/336* (2013.01)

(58) Field of Classification Search
  USPC ........................................................ 343/904
  See application file for complete search history.

(56) References Cited

U.S. PATENT DOCUMENTS

| | | | |
|---|---|---|---|
| 7,629,902 B2* | 12/2009 | Zhang | H04L 25/0204 341/106 |
| 8,565,694 B2* | 10/2013 | Jones | H03F 1/0227 455/127.1 |
| 8,606,200 B2 | 12/2013 | Ripley et al. | |
| 9,054,759 B2 | 6/2015 | Watanabe | |
| 9,214,900 B2* | 12/2015 | Arkiszewski | H03F 3/19 |
| 9,484,865 B2 | 11/2016 | Kobayashi et al. | |
| 9,553,550 B2* | 1/2017 | Puliafico | H03F 3/19 |
| 9,595,930 B2* | 3/2017 | Garuti | H01P 1/36 |
| 2006/0006945 A1* | 1/2006 | Burns | H03F 3/211 330/295 |
| 2012/0056679 A1* | 3/2012 | Jones | H03F 1/0227 330/296 |
| 2013/0135052 A1* | 5/2013 | Arkiszewski | H03F 3/19 330/295 |

OTHER PUBLICATIONS

Jeon, et al., "A Triple-Mode Balanced Linear CMOS Power Amplifier Using a Switched-Quadrature Coupler", IEEE Journal of Solid-State Circuits; Year: 2012; vol. 47, No. 9, pp. 2019-2032., Sep. 2012, 14 pages.
Patel, et al., "Current Sensing for Automotive Electronics—A Survey (IDF #52530)", A. Patel and M. Ferdowsi, "Current Sensing for Automotive Electronics—A Survey," IEEE Transactions on Vehicular Technology, Institute of Electrical and Electronics Engineers (IEEE), Oct. 2009, Oct. 2009, 13 pages.
Rachakonda, et al., "Log amps and directional couplers enable VSWR detection", RF Design; Year: 2007; vol., No., pp. 28-35., Jan. 12, 2007, 4 pages.
Sengupta, et al., "On-chip Sensing and Actuation Methods for Integrated Self-healing mm-Wave CMOS Power Amplifier (IDF #52530)", 2012 IEEE MTT-S International Microwave Symposium Digest, Jun 2012, Jun. 2012, 3 pages.
Yamamoto, et al., "A Current-Mirror-Based GaAs-HBT RF Power Detector for Wireless Applications (IDF #52530)", 2007 IEEE Compound Semiconductor Integrated Circuit Symposium, Oct. 2007, Oct. 2007, 4 pages.

* cited by examiner

900

```
┌─────────────────────────────────────────┐
│ Perform a first power measurement by    │
│ detecting a power at an isolated port   │
│ of a quadrature output power combiner   │
│ implemented within a balanced power     │
│ amplifier, the balanced power amplifier │
│ including two power amplifying paths    │
│ that are respectively coupled to an     │
│ input port of the quadrature output     │
│ power combiner and a coupled port of    │
│ the quadrature output power combiner    │
│                  902                    │
└─────────────────────────────────────────┘
```

Perform a first power measurement by detecting a power at an isolated port of a quadrature output power combiner implemented within a balanced power amplifier, the balanced power amplifier including two power amplifying paths that are respectively coupled to an input port of the quadrature output power combiner and a coupled port of the quadrature output power combiner
902

↓

Perform a second measurement and a third measurement within the balanced power amplifier
904

↓

Determine a magnitude and a sign of a reflection coefficient based on the first measurement, the second measurement, and the third measurement
906

↓

Adjust operating conditions of the two power paths based on the reflection coefficient
908

FIG. 9

AMPLIFICATION IN PRESENCE OF A VARIABLE ANTENNA IMPEDANCE

TECHNICAL FIELD

This disclosure relates generally to a balanced power amplifier and, more specifically, to adjusting operating conditions of the balanced power amplifier based on a variable impedance of an antenna.

BACKGROUND

An electronic device may use a power amplifier and an antenna to transmit wireless communication signals. The power amplifier and the antenna can be designed to have matching impedances that enable power to be efficiently transferred from the power amplifier to the antenna without significant losses. The impedance of the antenna, however, can vary due to beamforming operations or a proximity of a user to the antenna. Consequently, the impedances of the power amplifier and the antenna can become mismatched and some power may be reflected back to the power amplifier. The reflected power can cause the power amplifier to experience decreased linearity or decreased power efficiency. In some cases, the reflected power may permanently damage the power amplifier.

SUMMARY

An apparatus is disclosed that implements amplification in the presence of a variable antenna impedance. The described techniques adjust operating conditions of a balanced power amplifier based on an impedance of an antenna. Three measurements are performed to determine a magnitude and sign of a reflection coefficient, which is indicative of the impedance of the antenna. Depending on the implementation, the measurements can include one or more power measurements, a resistance measurement, or current measurements. The operating conditions are adjusted based on the measurements such that the balanced power amplifier realizes improved performance, including improved linearity, power efficiency, or reliability. As such, these adjustments enable efficient utilization of components within the balanced power amplifier. This process can be performed multiple times throughout a normal mission mode or test mode. In this way, the operating conditions of the balanced power amplifier can be dynamically adjusted as the impedance of the antenna varies.

In an example aspect, an apparatus is disclosed. The apparatus includes a balanced power amplifier. The balanced power amplifier includes a first power amplifying path, a second power amplifying path, a quadrature output power combiner, detection circuitry, and control circuitry. The first power amplifying path includes a first power amplifier and the second power amplifying path includes a second power amplifier. The quadrature output power combiner has an input port, a coupled port, and an isolated port. The input port and the coupled port are respectively coupled to the first power amplifying path and the second power amplifying path. The detection circuitry includes at least one power detector and a resistor. The resistor is coupled between the isolated port and a ground. The power detector is coupled to the isolated port and configured to measure power at the isolated port. The power is based on a resistance of the resistor. The control circuitry is coupled to the first power amplifying path, the second power amplifying path, and the detection circuitry. The control circuitry is configured to adjust operating conditions of the first power amplifier and the second power amplifier based on the power that is measured at the isolated port.

In an example aspect, an apparatus is disclosed. The apparatus includes an antenna having an impedance and a balanced power amplifier. The balanced power amplifier includes an output node that is coupled to the antenna, a first power amplifying path, a second power amplifying path, and a quadrature output power combiner. The first power amplifying path includes a first power amplifier and the second power amplifying path includes a second power amplifier. The quadrature output power combiner has an input port, an output port, a coupled port, and an isolated port. The input port and the coupled port are respectively coupled to the first power amplifying path and the second power amplifying path. The output port is coupled to the output node. The apparatus also includes detection means for performing three measurements that are indicative of a reflection coefficient. The reflection coefficient is based on the impedance of the antenna. The detection means is coupled to the isolated port of the quadrature output power combiner. The apparatus further includes control means for adjusting operating conditions of the first power amplifier and the second power amplifier based on the reflection coefficient.

In an example aspect, an apparatus is disclosed. The apparatus includes an antenna having an impedance, bias voltage circuitry, a power supply, and a balanced power amplifier. The bias voltage circuitry is configured to provide a first bias voltage and a second bias voltage. The power supply is configured to provide a first supply voltage and a second supply voltage. The balanced power amplifier includes an output node coupled to the antenna, an input node configured to obtain a communication signal, a quadrature input power splitter, a quadrature output power combiner, a first power amplifying path, a second power amplifying path, and control circuitry. The quadrature input power splitter has an input port coupled to the input node, an output port, and a coupled port. The quadrature output power combiner has another input port, another output port coupled to the output node, and another coupled port. The first power amplifying path is coupled between the coupled port of the quadrature input power splitter and the input port of the quadrature output power combiner. The first power amplifying path includes a first power amplifier configured to amplify the communication signal using the first bias voltage and the first supply voltage. The second power amplifying path is coupled between the input port of the quadrature input power splitter and the coupled port of the quadrature output power combiner. The second power amplifying path includes a second power amplifier configured to amplify the communication signal using the second bias voltage and the second supply voltage. The control circuitry is coupled to the bias voltage circuitry and the power supply. The control circuitry is configured to cause the bias voltage circuitry to adjust both the first bias voltage and the second bias voltage based on the impedance of the antenna. The control circuitry is also configured to adjust both the first supply voltage and the second supply voltage based on the impedance of the antenna.

In an example aspect, a method for amplification in presence of a variable antenna impedance is disclosed. The method includes performing a first power measurement by detecting a power at an isolated port of a quadrature output power combiner that is implemented within a balanced power amplifier. The balanced power amplifier includes two power amplifying paths that are respectively coupled to an input port of the quadrature output power combiner and a coupled port of the quadrature output power combiner. The method additionally includes performing a second measurement and a third measurement within the balanced power amplifier. The method further includes determining a magnitude and a sign of a reflection coefficient based on the first measurement, the second measurement, and the third measurement. Based on the reflection coefficient, the method additionally includes adjusting operating conditions of the two power amplifying paths.

BRIEF DESCRIPTION OF DRAWINGS

FIG. 9 is a flow diagram illustrating an example process for performing amplification in the presence of a variable antenna impedance.

DETAILED DESCRIPTION

Variations in an antenna's impedance can degrade performance of a power amplifier or may cause the power amplifier to become permanently damaged. To obtain an indication of the antenna's impedance, some techniques measure a magnitude of a reflection coefficient. The reflection coefficient can be determined from a perspective of the power amplifier having a load impedance that is based on the impedance of the antenna. These techniques, however, may be unable to determine a direction or sign of the reflection coefficient. Without this knowledge, these techniques may be unable to make appropriate adjustments to the power amplifier based on the impedance of the antenna.

In contrast, techniques for amplification in the presence of a variable antenna impedance are described herein. The described techniques adjust operating conditions of a balanced power amplifier based on an impedance of an antenna. Three measurements are performed to determine a magnitude and sign of a reflection coefficient, which is indicative of the impedance of the antenna. Depending on the implementation, the measurements can include one or more power measurements, a resistance measurement, or current measurements. The operating conditions are adjusted based on the measurements such that the balanced power amplifier realizes improved performance, including improved linearity, power efficiency, or reliability. As such, these adjustments enable efficient utilization of components within the balanced power amplifier. This process can be performed multiple times throughout a normal mission mode or test mode. In this way, the operating conditions of the balanced power amplifier can be dynamically adjusted as the impedance of the antenna varies.

Figure 1:
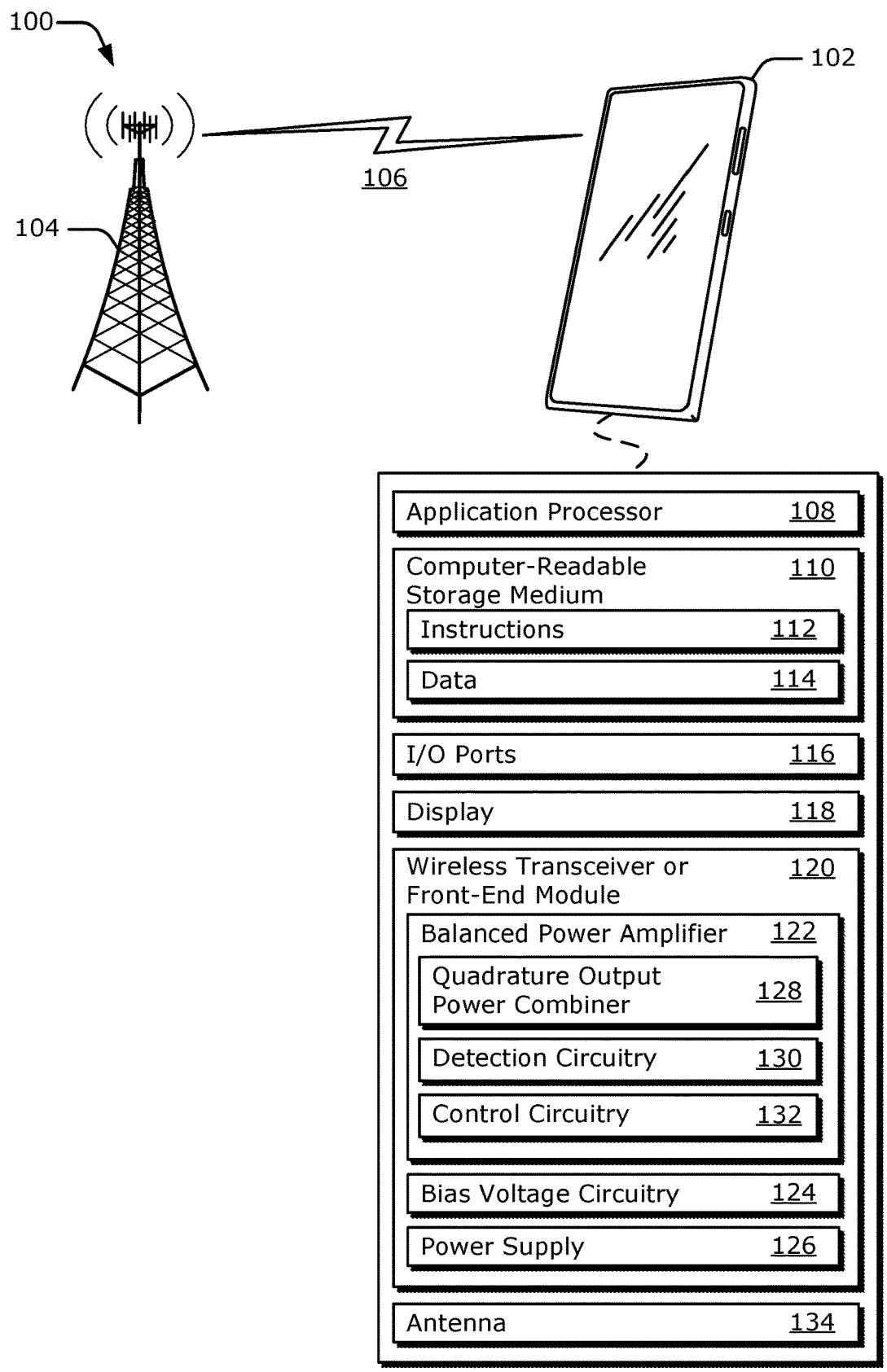
FIG. 1 illustrates an example operating environment for performing amplification in the presence of a variable antenna impedance.

FIG. 1 illustrates an example environment 100 for performing amplification in the presence of a variable antenna impedance. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as 3rd Generation Partnership Project Long-Term Evolution (3GPP LTE), 5th Generation (5G), IEEE 802.11, IEEE 802.16, Bluetooth™, and so forth. In some implementations, instead of or in addition to providing a data link, the wireless link 106 may wirelessly provide power and the base station 104 may comprise a power source.

The computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver or front-end module 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver or front-end module 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver or front-end module 120 enables the computing device 102 to communicate with the base station 104 and networks connected therewith.

The wireless transceiver or front-end module 120 includes circuitry and logic for transmitting and receiving communication signals via at least one antenna 134. Components of the wireless transceiver or front-end module 120 can include amplifiers, switches, mixers, analog-to-digital converters, filters, and so forth for conditioning the communication signals. The wireless transceiver or front-end module 120 may also include logic to perform in-phase/quadrature (I/Q) operations, such as synthesis, encoding, modulation, decoding, demodulation, and so forth. In some cases, components of the wireless transceiver or front-end module 120 are implemented as separate receiver and transmitter entities. Additionally or alternatively, the wireless transceiver or front-end module 120 can be realized using multiple or different sections to implement respective receiving and transmitting operations (e.g., separate transmit and receiver chains). In general, the wireless transceiver or front-end module 120 processes data and/or signals associated with communicating data of the computing device 102 over the antenna 134.

The wireless transceiver or front-end module 120 includes a balanced power amplifier 122, bias voltage circuitry 124, and a power supply 126. The bias voltage circuitry 124 and the power supply 126 respectively provide bias voltages and supply voltages to the balanced power amplifier 122. The balanced power amplifier 122 may be coupled to the antenna 134 via a transmission line or other front-end components such as an antenna switch module (ASM) or a filter (not shown). Using the bias voltages and the supply voltages, the balanced power amplifier 122 amplifies a communication signal (e.g., an uplink signal), which is transmitted via the antenna 134.

A largest amount of energy is transferred to the antenna 134 if the balanced power amplifier 122, the transmission line, and the antenna 134 have matched impedances (e.g., are at a matched condition). If the antenna 134 becomes unmatched (e.g., due to a beamforming operation, a proximity of an object such as a user's hand, an unmatched front-end component (e.g., an unmatched antenna switch module or filter), or based on a frequency band), some power may be reflected back to the balanced power amplifier 122. This produces standing waves, which are measured by a voltage standing wave ratio (VSWR). The voltage standing wave ratio is based on a reflection coefficient, which represents a ratio of an amount of power that is reflected back from the antenna 134 to an amount of incident power that is absorbed by or transferred to the antenna 134. In general, larger values of the voltage standing wave ratio or the reflection coefficient are indicative of a larger amount of reflected power and a larger impedance mismatch.

The balanced power amplifier 122 includes at least one quadrature output power combiner 128, detection circuitry 130, and control circuitry 132. The quadrature output power combiner 128 combines two power amplifying paths of the balanced power amplifier 122 to amplify the communication signal. The detection circuitry 130 and the control circuitry 132 perform an antenna impedance calibration process that detects a magnitude and a sign of the reflection coefficient and adjusts operating conditions of the balanced power amplifier 122 accordingly. By continually detecting the reflection coefficient and making appropriate adjustments, the balanced power amplifier 122 can realize improved performance in the presence of a variable antenna impedance.

The control circuitry 132 can be implemented in software (which is incorporated in or realized using hardware and may be executed by a digital signal processor or a modem), firmware, hardware, fixed logic circuitry (e.g., digital logic gates), or combinations thereof. The control circuitry 132 may also perform other operations, such as providing timing control, performing register reads or writes, or implementing a state machine for wireless communication operations. Various implementations of the detection circuitry 130 are further described with respect to FIGS. 4-6.

Figure 2:
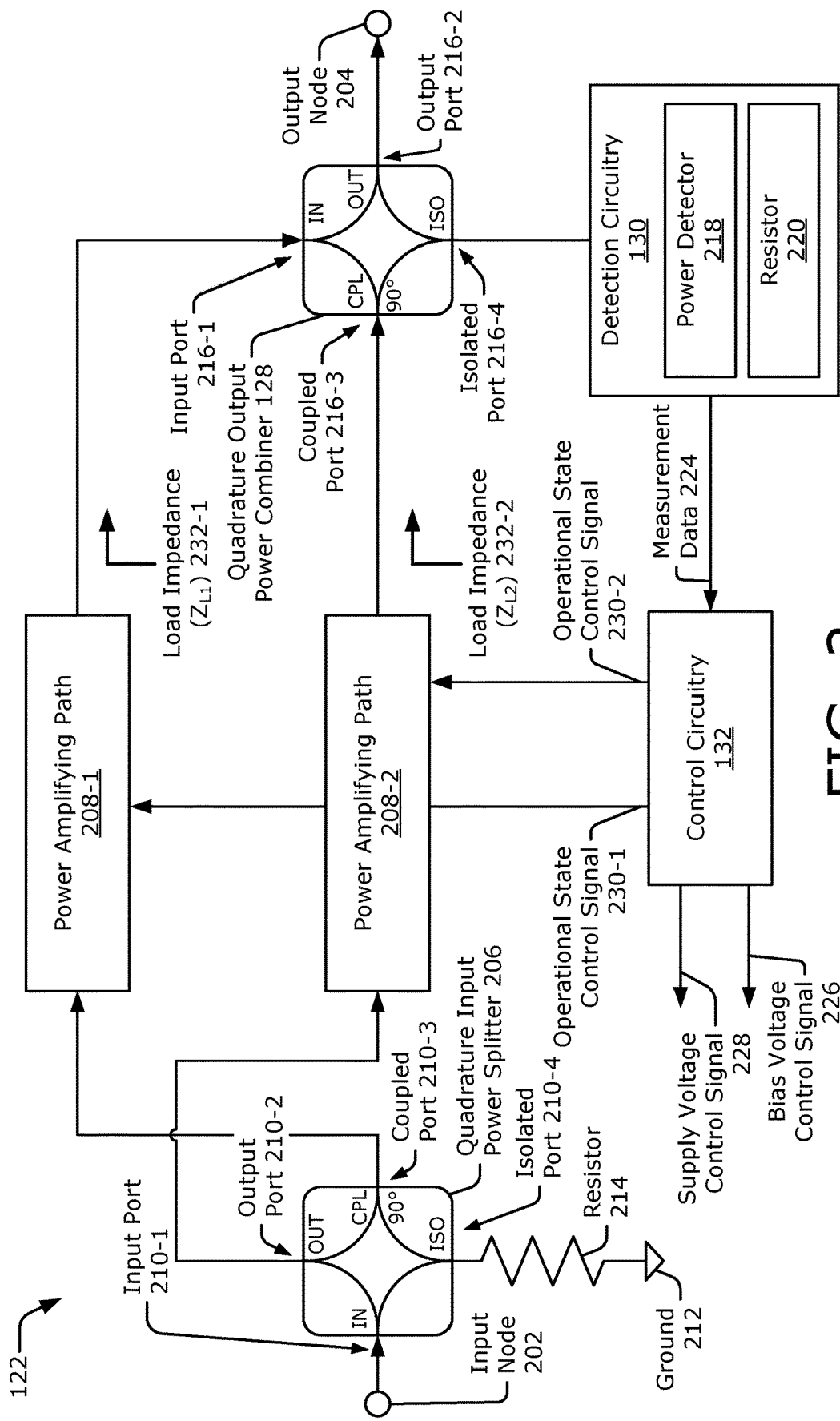
FIG. 2 illustrates an example balanced power amplifier for performing amplification in the presence of a variable antenna impedance.

FIG. 2 illustrates an example balanced power amplifier 122 for performing amplification in the presence of a variable antenna impedance. In the depicted configuration, the balanced power amplifier 122 includes an input node 202, an output node 204, a quadrature input power splitter 206, two power amplifying paths 208-1 and 208-2, the quadrature output power combiner 128, the detection circuitry 130, and the control circuitry 132. The input node 202 can be coupled to other components within the wireless transceiver or front-end module 120, such as a filter or a mixer. The output node 204 can be coupled to the transmission line and the antenna 134 (not shown). In this example, the balanced power amplifier 122 is considered to provide a last amplifier stage within a transmission chain of the wireless transceiver or front-end module 120 (e.g., there is not another amplifier between the output node 204 and the antenna 134.

The quadrature input power splitter 206 and the quadrature output power combiner 128 are three-decibel (3 dB) 90° hybrid couplers. The quadrature input power splitter 206 has four ports, which are identified as an input port 210-1, an output port 210-2, a coupled port 210-3, and an isolated port 210-4. The input port 210-1 is coupled to the input node 202 and a resistor 214 is coupled between the isolated port 210-4 and a ground 212. The quadrature output power combiner 128 also has four ports, which are identified as an input port 216-1, an output port 216-2, a coupled port 216-3, and an isolated port 216-4. The output port 216-2 is coupled to the output node 204 and the isolated port 216-4 is coupled to the detection circuitry 130.

The first power amplifying path 208-1 and the second power amplifying path 208-2 are generally considered parallel power amplifying paths, which respectively include one or more amplifier stages. The first power amplifying path 208-1 is coupled between the coupled port 210-3 of the quadrature input power splitter 206 and the input port 216-1 of the quadrature output power combiner 128. The second power amplifying path 208-2 is coupled between the output port 210-2 of the quadrature input power splitter 206 and the coupled port 216-3 of the quadrature output power combiner 128. By having each power amplifying path 208-1 and 208-2 coupled to one of the coupled ports 210-3 or 216-3, the resulting outputs of the two power amplifying paths 208-1 and 208-2 are combined in phase at the output port 216-2 of the quadrature output power combiner 128. Due to this architecture, the two power amplifying paths 208-1 and 208-2 are affected by the impedance of the antenna 134 differently.

Consider that the power amplifying path 208-1 experiences a load impedance 232-1 ($Z_{L1}$) and the power amplifying path 208-2 experiences a load impedance 232-2 ($Z_{L2}$), both of which are dependent upon the impedance of the antenna 134. If the impedance of the antenna 134 varies from the matched condition (e.g., increases or decreases relative to the matched impedance such as 50 ohms), the input port 216-1 and the coupled port 216-3 of the quadrature output power combiner 128 cause the load impedances 232-1 and 232-2 to be unequal and inversely related to one another (e.g., $Z_{L1}=1/Z_{L2}$). In other words, if the impedance of the antenna 134 is larger than the matched condition, the load impedance 232-1 becomes larger than the load impedance 232-2. Likewise, if the impedance of the antenna 134 is smaller than the matched condition, the load impedance 232-1 becomes smaller than the load impedance 232-2. This inverse relationship is referred to as load-line modulation.

In general, the balanced power amplifier 122 obtains a communication signal, such as an uplink signal, at the input node 202. The quadrature input power splitter 206 splits the communication signal into two portions, which are approximately equal in amplitude (e.g., a 3 dB power split) and differ in phase by approximately ninety degrees. The power amplifying paths 208-1 and 208-2 respectively obtain these two portions via the coupled port 210-3 and the output port 210-2. The power amplifying paths 208-1 and 208-2 amplify the two portions of the communication signal and produce two amplified portions that are approximately equal in amplitude and differ in phase by approximately ninety degrees. The quadrature output power combiner 128 obtains the two amplified portions at the input port 216-1 and the coupled port 216-3, respectively, and combines the two amplified portions into a combined communication signal at the output port 216-2. The resulting amplified communication signal at the output port 216-2 is rotated in phase by approximately ninety degree with respect to the communication signal obtained at the input port 210-1 of the quadrature input power splitter 206. The quadrature output power combiner 128 provides the resulting amplified communication signal to the output node 204 of the balanced power amplifier 122. The wireless transceiver or front-end module 120 provides the amplified communication signal for transmission via the antenna 134.

In FIG. 2, the detection circuitry 130 is shown to be at least coupled to the isolated port 216-4 and include at least one power detector 218 and at least one resistor 220. The resistor 220 may be a fixed resistor or a variable (e.g., programmable) resistor in different implementations. The power detector 218 may be implemented as a root mean square (RMS) power detector, which generates a direct current (DC) output that is proportional to the root mean square of a reflected signal that is obtained at the isolated port 216-4. The power detector 218 measures power at the isolated port 216-4, which comprises one of the three measurements the detection circuitry 130 performs to generate measurement data 224. Depending on the implementation, the measurement data 224 may also include other power measurements, resistance measurements, or current measurements, as further described with respect to FIGS. 4-6. In general, the measurement data 224 contains information that can be used to determine the voltage standing wave ratio and the reflection coefficient (e.g., both a magnitude and a sign of the reflection coefficient).

The control circuitry 132 generates a bias voltage control signal 226, a supply voltage control signal 228, or two operational state control signals 230-1 and 230-2 based on the measurement data 224. Using these signals, the control circuitry 132 adjusts operating conditions of the power amplifying paths 208-1 and 208-2. This enables the control circuitry 132 to account for the load-line modulation experienced by the balanced power amplifier 122 as a result of the impedance of the antenna 134 varying from the matched condition. For example, the bias voltage control signal 226 is provided to the bias voltage circuitry 124 (not shown) to adjust respective bias voltages that are provided to the two power amplifying paths 208-1 and 208-2. In this way, appropriate bias conditions can be provided to account for changes to the load impedances 232-1 and 232-2. The control circuitry 132 can utilize a look-up table to determine the bias voltages based on the measurement data 224. By adjusting the bias voltages, the control circuitry 132 can reduce distortion and improve linearity of the balanced power amplifier 122 for different impedances of the antenna 134. Better linearity enables the wireless transceiver 120 to realize a decreased error-vector magnitude (EVM) (e.g., relative constellation error) for wireless communications. In order words, the adjustments can reduce amplitude or phase errors to approach a target constellation point used for modulation techniques such as quadrature amplitude modulation (QAM) or quadrature phase shift keying (QPSK).

The control circuitry 132 can also provide the supply voltage control signal 228 to the power supply 126 (not shown) to adjust respective supply voltages that are provided to the two power amplifying paths 208-1 and 208-2. In this way, power efficiency of the balanced power amplifier 122 can be improved for different impedances of the antenna 134. The supply voltages may also be decreased to protect the amplifiers within the power amplifying paths 208-1 or 208-2 if the voltage standing wave ratio exceeds a reliability threshold.

The operational state control signals 230-1 and 230-2 respectively control an operational state of the power amplifying paths 208-1 and 208-2. In other words, the operational state control signals 230-1 and 230-2 can enable (e.g., activate) or disable (e.g., deactivate) the power amplifying paths 208-1 and 208-2, respectively (e.g., enable or disable one or more amplifiers within the power amplifying paths 208-1 and 208-2). If the voltage standing wave ratio exceeds the reliability threshold, for example, the control circuitry 132 can disable one or more of the power amplifying paths 208-1 and 208-2 to protect the amplifiers from being damaged and increase reliability of the balanced power amplifier 122. An example reliability threshold may be approximately 10:1 or greater than approximately 6:1, and may be based on characteristics of the amplifiers. In some cases, the wireless transceiver or front-end module 120 may continue to perform wireless communications albeit at a lower transmission power because the load-line modulation may cause only one of the power amplifying paths 208-1 or 208-2 to be at risk of being damaged and therefore disabled by the control circuitry 132. In general, the adjustments to the operating conditions of the power amplifying paths 208-1 and 208-2 are individually controllable to account for the load-line modulation. Example implementations of the power amplifying paths 208-1 and 208-2 are further described with respect to FIG. 3.

Figure 3:
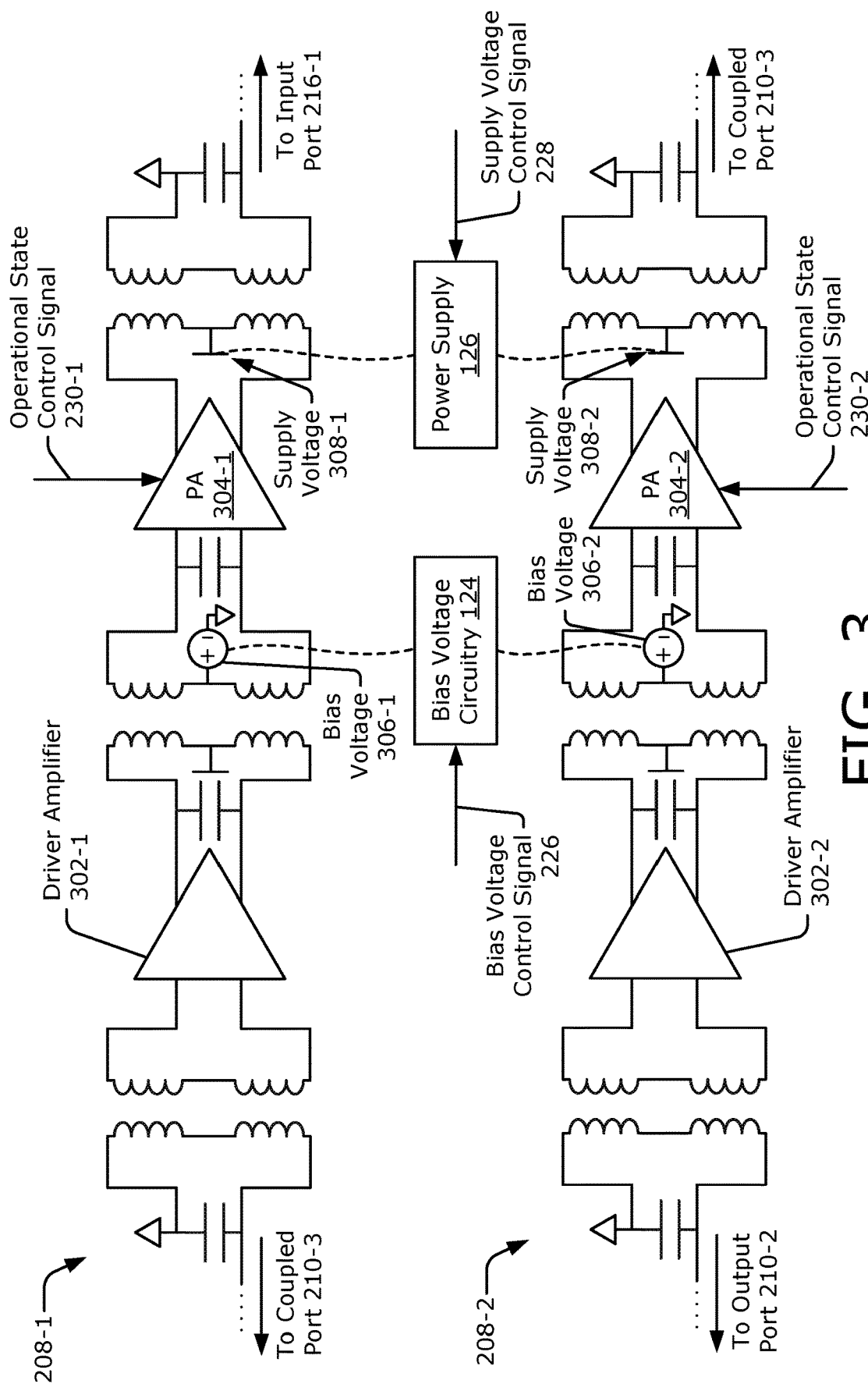
FIG. 3 illustrates two example power amplifying paths for performing amplification in the presence of a variable antenna impedance.

FIG. 3 illustrates two example power amplifying paths 208-1 and 208-2 for performing amplification in the presence of a variable antenna impedance. In the depicted configuration, the two power amplifying paths 208-1 and 208-2 respectively include two cascaded amplifier stages, though any quantity of amplifying stages may be implemented. The power amplifying path 208-1 includes a driver amplifier 302-1 within a first amplifying stage and a power amplifier (PA) 304-1 within a last amplifying stage. Similarly, the power amplifying path 208-2 includes another driver amplifier 302-2 and another power amplifier 304-2. In addition to the amplifiers, the power amplifying paths 208-1 and 208-2 also include impedance matching circuitry, which is implemented using transformers in this implementation.

The power amplifiers 304-1 and 304-2 are respectively coupled to bias voltages 306-1 and 306-2 and supply voltages 308-1 and 308-2, which enable the power amplifiers 304-1 and 304-2 to operate and provide amplification. The bias voltage 306-1 and 306-2, for example, can be applied to respective inputs of the power amplifiers 304-1 and 304-2. The supply voltages 308-1 and 308-2 are shown to be coupled to respective outputs of the power amplifiers 304-1 and 304-2. Example implementations of the power amplifiers 304-1 and 304-2 are further described in FIG. 7.

The bias voltage circuitry 124 generates the bias voltages 306-1 and 306-2 based on the bias voltage control signal 226. The bias voltages 306-1 and 306-2 are independently controllable and may or may not be equal to each other. Adjusting the bias voltages 306-1 and 306-2 causes the bias conditions of the power amplifiers 304-1 and 304-2 to be adjusted. To account for the load-line modulation, the bias voltages 306-1 and 306-2 may be adjusted by similar amounts though in opposite directions (e.g., one of the bias voltages 306-1 or 306-2 can be increased by an amount while the other bias voltage 306-1 or 306-2 can be decreased by the amount). These adjustments can improve linearity performance of the balanced power amplifier 122 in the presence of the variable antenna impedance.

Similarly, the power supply 126 generates the supply voltages 308-1 and 308-2 based on the supply voltage control signal 228. The supply voltages 308-1 and 308-2 are also independently controllable and may or may not be equal to each other. To account for the load-line modulation, the supply voltages 308-1 and 308-2 may also be adjusted by similar amounts though in opposite directions (e.g., one of the supply voltages 308-1 or 308-2 can be increased by an amount while the other supply voltage 308-1 or 308-2 can be decreased by the amount). If the load impedance 232-1 of FIG. 2 increases relative to the matched condition, for example, the supply voltage 308-1 can be reduced to reduce power consumption. Likewise, if the load impedance 232-1 decreases relative to the matched condition, the supply voltage 308-2 can be increased. These adjustments can improve power efficiency and amplification performance of the balanced power amplifier 122 in the presence of the variable antenna impedance.

The power amplifiers 304-1 and 304-2 are also coupled to the control circuitry 132 (not shown) and respectively obtain the operational state control signals 230-1 and 230-2. The operational state control signals 230-1 and 230-2 specify operational states (e.g., an on-state or an off-state) of the power amplifiers 304-1 and 304-2, respectively. In general, the power amplifying paths 208-1 and 208-2 are considered disabled if the respective amplifiers within the last amplifier stages are turned off. These adjustments enable the power amplifiers 304-1 and 304-2 to be protected in the presence of the variable antenna impedance. Three example implementations of the detection circuitry 130 are further described with respect to FIGS. 4-6.

Figure 4:
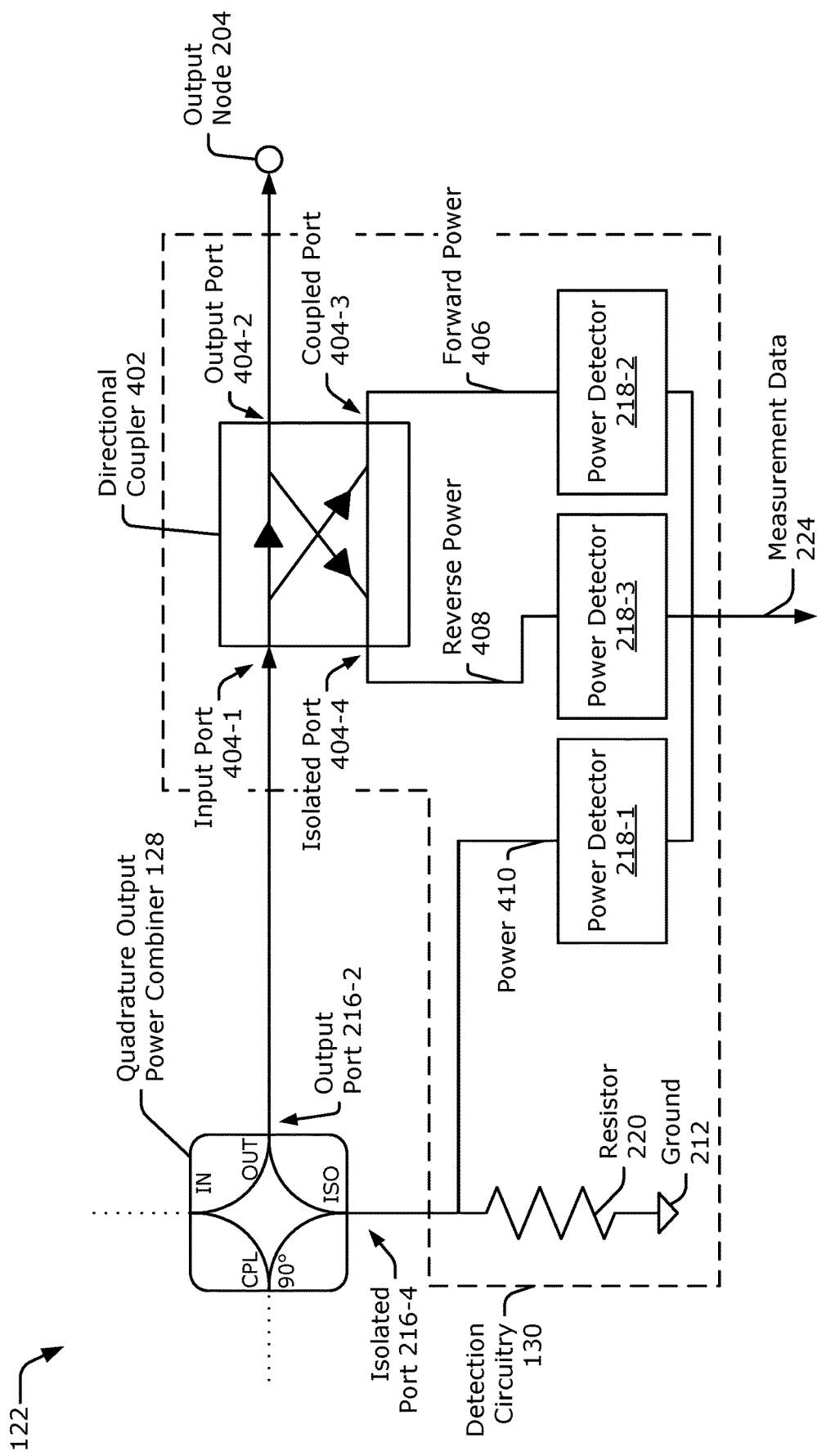
FIG. 4 illustrates an example implementation of detection circuitry for performing amplification in the presence of a variable antenna impedance.

FIG. 4 illustrates an example implementation of the detection circuitry 130 for performing amplification in the presence of a variable antenna impedance. In the depicted configuration, the detection circuitry 130 includes the resistor 220, a directional coupler 402, and three power detectors 218-1, 218-2, and 218-3. The resistor 220 is coupled between the isolated port 216-4 of the quadrature output power combiner 128 and the ground 212. A resistance of the resistor 220 may be some fixed value that represents the matched impedance, such as approximately 50 ohms. The directional coupler 402 has four ports, which are represented by an input port 404-1, an output port 404-2, a coupled port 404-3, and an isolated port 404-4. The power detector 218-1 is coupled to the isolated port 216-4 and measures a power 410 at the isolated port 216-4. Likewise, the power detectors 218-2 and 218-3 are respectively coupled to the coupled port 404-3 and the isolated port 404-4 and respectively measure a forward power 406 at the coupled port 404-3 and a reverse power 408 at the isolated port 404-4. In this implementation, the measurement data 224 comprises the three power measurements 406, 408, and 410, which enable a magnitude and a sign of a reflection coefficient to be determined. The magnitude and sign of the reflection coefficient represents a magnitude and a sign of power that is reflected by the antenna 134.

The power measurements are obtained based on different operational states of the power amplifying paths 208-1 and 208-2, which can be set by the control circuitry 132 using the operational state control signals 230-1 and 230-2. The control circuitry 132, for example, can enable both of the power amplifying paths 208-1 and 208-2 or enable one of the power amplifying paths 208-1 or 208-2. To determine the magnitude of the reflection coefficient, the detection circuitry 130 measures the forward power 406 using the power detector 218-2 and the reverse power 408 using the power detector 218-3 based on both of the power amplifying paths 208-1 and 208-2 being enabled. The forward power 406 and the reverse power 408 are indicative of the magnitude of the reflection coefficient because the magnitude of the reflection coefficient is based on a ratio of the reverse power 408 to the forward power 406. The control circuitry 132 may directly determine the magnitude of the reflection coefficient by multiplying the ratio by a coupling factor. In general, the coupling factor is a constant value that can be predetermined and stored in a memory (e.g., such as the computer-readable storage medium 110).

To determine a sign of the reflection coefficient, the detection circuitry 130 measures the forward power 406 with the first power amplifying path 208-1 enabled and the second power amplifying path 208-2 disabled. In this situation, the forward power 406 is based on the impedance of the antenna 134. Additionally, the power 410 at the isolated port 216-4 is measured by the power detector 218-1 with the second power amplifying path 208-2 enabled and the first power amplifying path 208-1 disabled. In this instance, the power 410 is based on the resistance of the resistor 220. Comparing the forward power 406 to the power 410 provides an indication of whether the power amplifying path 208-1 is observing a load impedance 232-1 that is higher or lower than the resistance of the resistor 220. If the forward power 406 is greater than the power 410 at the isolated port 404-4, the reflection coefficient is positive (e.g., greater than zero). In other words, the impedance of the antenna 134 is larger than the matched impedance. Alternatively, if the forward power 406 is less than the power 410, the reflection coefficient is negative (e.g., less than zero). This means that the impedance of the antenna 134 is smaller than the matched impedance. Instead of performing three-step power measurements, another implementation that varies the resistance of the resistor 220 to determine the reflection coefficient is further described with respect to FIG. 5.

Figure 5:
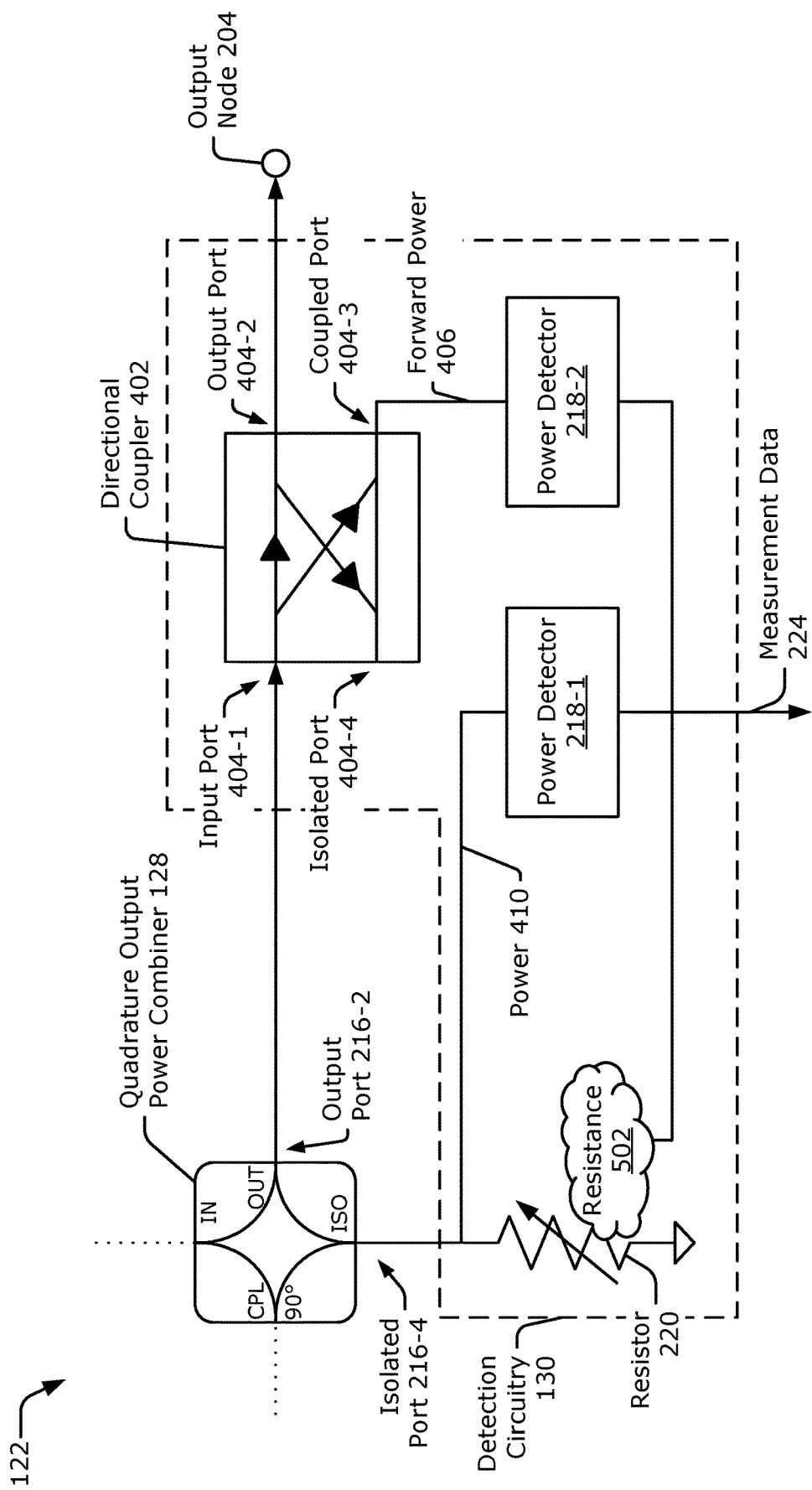
FIG. 5 illustrates another example implementation of detection circuitry for performing amplification in the presence of a variable antenna impedance.

FIG. 5 illustrates another implementation of the detection circuitry 130 for performing amplification in the presence of a variable antenna impedance. This implementation is similar to the implementation depicted in FIG. 4, with the exception that the resistor 220 is implemented as a variable resistor and that two power detectors (e.g., power detectors 218-1 and 218-2) are used instead of three. In the depicted configuration, the detection circuitry 130 measures the forward power 406 with the first power amplifying path 208-1 enabled and the second power amplifying path 208-2 disabled. The detection circuitry 130 also collects multiple measurements of the power 410 with the second power amplifying path 208-2 enabled and the first power amplifying path 208-1 disabled. The multiple measurements are collected for different resistances 502 of the resistor 220. By adjusting or sweeping the resistance 502 of the resistor 220 while collecting the multiple measurements of the power 410, the detection circuitry 130 can determine which resistance 502 causes a difference between the forward power 406 and the power 410 to be minimal. In general, the resistance 502 is swept across any range of potential impedances of the antenna 134, such as from approximately ten ohms to five hundred ohms. The value of the resistance 502 that minimizes the difference between the forward power 406 and the power 410 approximates a real part of the impedance of the antenna 134. Accordingly, the resistance 502 can be included in the measurement data 224 to enable the control circuitry 132 to determine the magnitude and the sign of the reflection coefficient based on a predetermined characteristic impedance of the transmission line.

In comparing the implementation of FIG. 5 to that of FIG. 4, fewer power detectors 218 may be used and an extra step of enabling both of the power amplifying paths 208-1 and 208-2 is avoided. However, this technique may require additional time in order to sweep through the multiple resistances 502. In both of the implementations of FIGS. 4 and 5, the directional coupler 402 can take up additional space within the wireless transceiver or front-end module 120 and cause additional loss between the quadrature output power combiner 128 and the antenna 134. As an alternative, another implementation that uses multiple current sensors is described with respect to FIG. 6.

Figure 6:
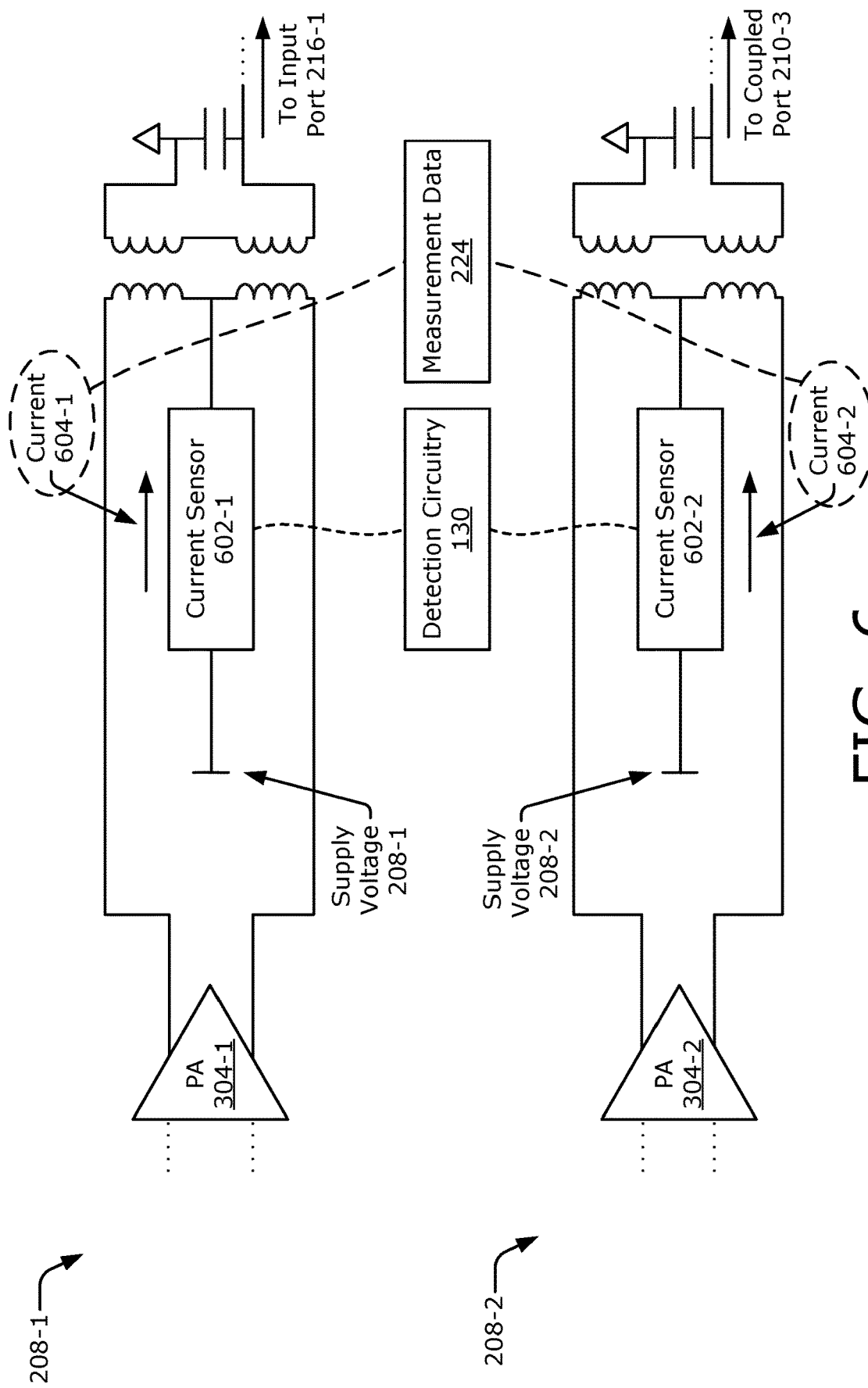
FIG. 6 illustrates yet another example implementation of detection circuitry for performing amplification in the presence of a variable antenna impedance.

FIG. 6 illustrates yet another implementation of the detection circuitry 130 for performing amplification in the presence of a variable antenna impedance. In the depicted configuration, the detection circuitry 130 includes current sensors 602-1 and 602-2, the power detector 218-1 (e.g., as shown in FIG. 4 or 5), and the resistor 220 (e.g., as shown in FIG. 4 or 5). The current sensor 602-1 is coupled between the supply voltage 308-1 and an output of the power amplifier 304-1. Similarly, the current sensor 602-2 is coupled between the supply voltage 308-2 and an output of the power amplifier 304-2. The current sensors 602-1 and 602-2 respectively measure currents 604-1 and 604-2 within the power amplifying paths 208-1 and 208-2.

To determine the magnitude of the reflection coefficient, the detection circuitry 130 measures the power 410 at the isolated port 216-4 with the power amplifying paths 208-1 and 208-2 enabled. Although the power 410 cannot be used to determine the magnitude of the reflection coefficient directly, the control circuitry 132 can reference a look-up table or calibration data to map the power 410 to a corresponding magnitude of the reflection coefficient or a voltage standing wave ratio.

To determine the sign of the reflection coefficient, the current sensor 602-1 measures the current 604-1 with the power amplifying path 208-1 enabled and the power amplifying path 208-2 disabled. The current sensor 602-2 also measures the current 604-2 with the power amplifying path 208-2 enabled and the power amplifying path 208-1 disabled. Comparing the first current 604-1 to the second current 604-2 indicates which power amplifying path 208-1 or 208-2 experiences a larger load impedance 232-1 or 232-2. If the current 604-1 is larger than the current 604-2, the load impedance 232-1 is smaller than the load impedance 232-2. This corresponds to the antenna 134's impedance being smaller than the resistance 502 of the resistor 220 and the reflection coefficient being negative. Alternatively, if the first current 604-1 is smaller than the second current 604-2, the load impedance 232-1 is larger than the load impedance 232-2, which corresponds to the reflection coefficient being positive. The detection circuitry 130 can include the measured currents 604-1 and 604-2 along with the power 410 in the measurement data 224. Based on the measurement data 224, the control circuitry 132 can determine the reflection coefficient and the voltage standing wave ratio and make appropriate adjustments to the operating conditions of the power amplifying paths 208-1 and 208-2. An example implementation of the current sensors 602-1 or 602-2 is further described with respect to FIG. 7.

Figure 7:
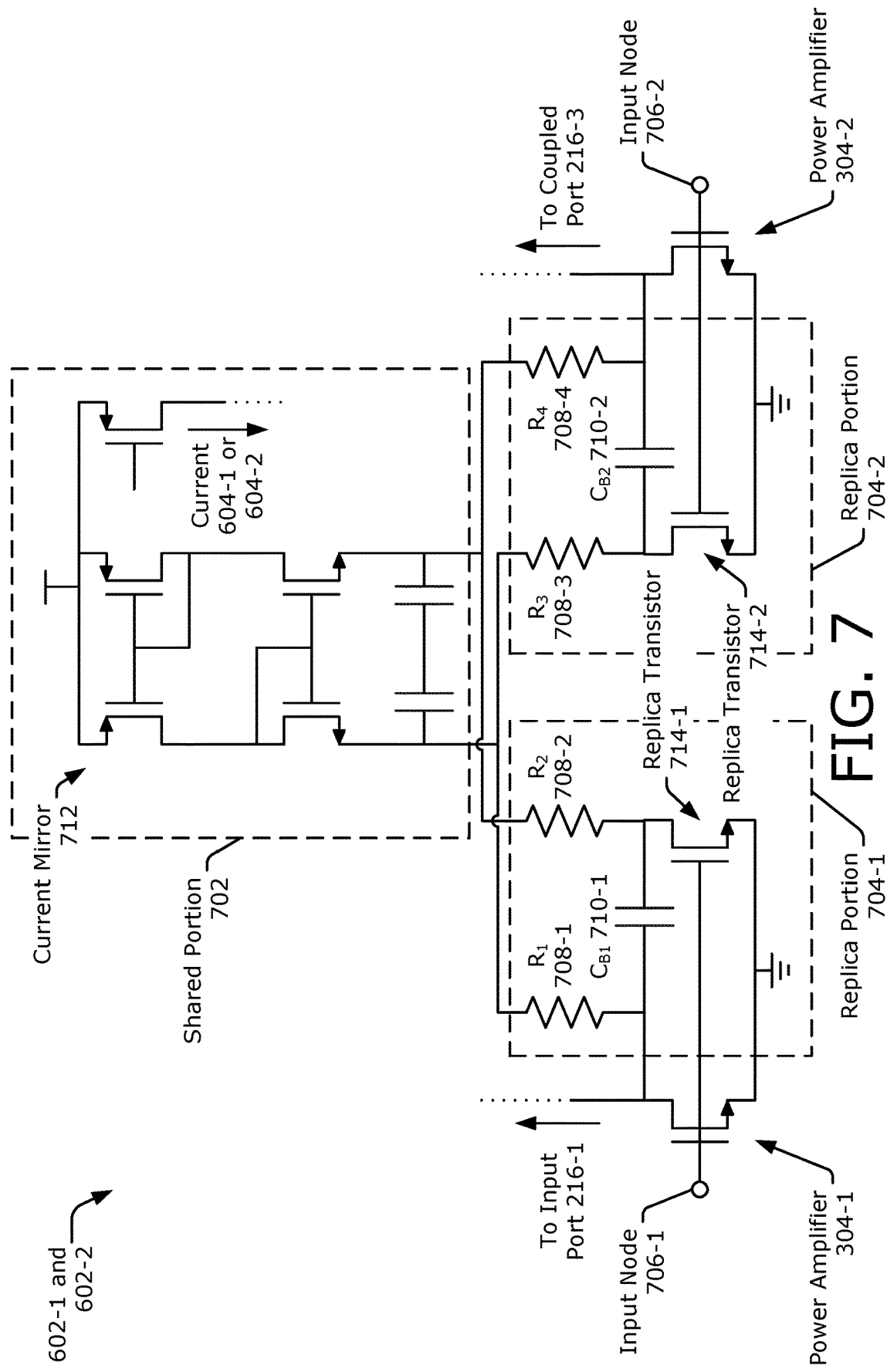
FIG. 7 illustrates an example implementation of a current sensor for performing amplification in the presence of a variable antenna impedance.

FIG. 7 illustrates an example implementation of the current sensors 602-1 and 602-2 for performing amplification in the presence of a variable antenna impedance. In the depicted configuration, the power amplifiers 304-1 and 304-2 are implemented using n-channel metal-oxide semiconductor field-effect transistors (NMOSFETs), which are configured as common-source amplifiers. Input nodes 706-1 and 706-2 are coupled to respective gates of the common-source amplifiers. In this configuration, the bias voltage circuitry 124 may be coupled to the input nodes 706-1 and 706-2 and the power supply 126 may be coupled to drains of the common-source amplifiers.

The current sensors 602-1 and 602-2 include a shared portion 702 and respective replica portions 704-1 and 704-2. The shared portion 702 includes one or more current mirrors 712, which may be implemented using NMOSFETs, p-channel metal-oxide semiconductor field-effect transistors (PMOSFETs), or a combination thereof. The shared portion 702 can be implemented in any convenient space on a same die as the replica portions 704-1 and 704-2 or on a separate die. In general, the replica portions 704-1 and 704-2 are located near the power amplifiers 304-1 and 304-2, respectively. This improves measurement accuracies of the currents 604-1 or 604-2 as the replica portions 704-1 and 704-2 are affected by respective gate-to-source voltages and drain-to-source voltages of the power amplifiers 304-1 and 304-2.

The replica portions 704-1 and 704-2 include respective replica transistors 714-1 and 714-2, which have width-to-length ratios that are scaled relative to the power amplifiers 304-1 and 304-2. A pair of resistors within each replica portion (e.g., resistors 708-1 and 708-2 within replica portion 704-1 or resistors 708-3 and 708-4 within replica portion 704-2) can be scaled by a constant value K (e.g., $R_2=KR_1$ and $R_4=KR_3$). The constant value K can also represent a scaling of width-to-length ratios between different branch transistors within the current mirror 712. The replica portions 704-1 and 704-2 also include capacitors 710-1 and 710-2, which are respectively coupled between the replica transistors 714-1 and 714-2 and the power amplifiers 304-1 and 304-2. These capacitors 710-1 and 710-2 enable currents in the replica portions 704-1 and 704-2 to be fed into the outputs of the power amplifiers 304-1 and 304-2 to reduces losses within the balanced power amplifier 122.

This current sensor architecture also avoids the use of series circuit elements, which avoids additional losses that can decrease an amount of amplification provided by the balanced power amplifier 122. In general, the current sensors 602-1 and 602-2 have a negligible impact on the balanced power amplifier 122's performance. In other implementations, the current sensors 602-1 or 602-2 can be implemented using a complementary circuit.

Figure 8:
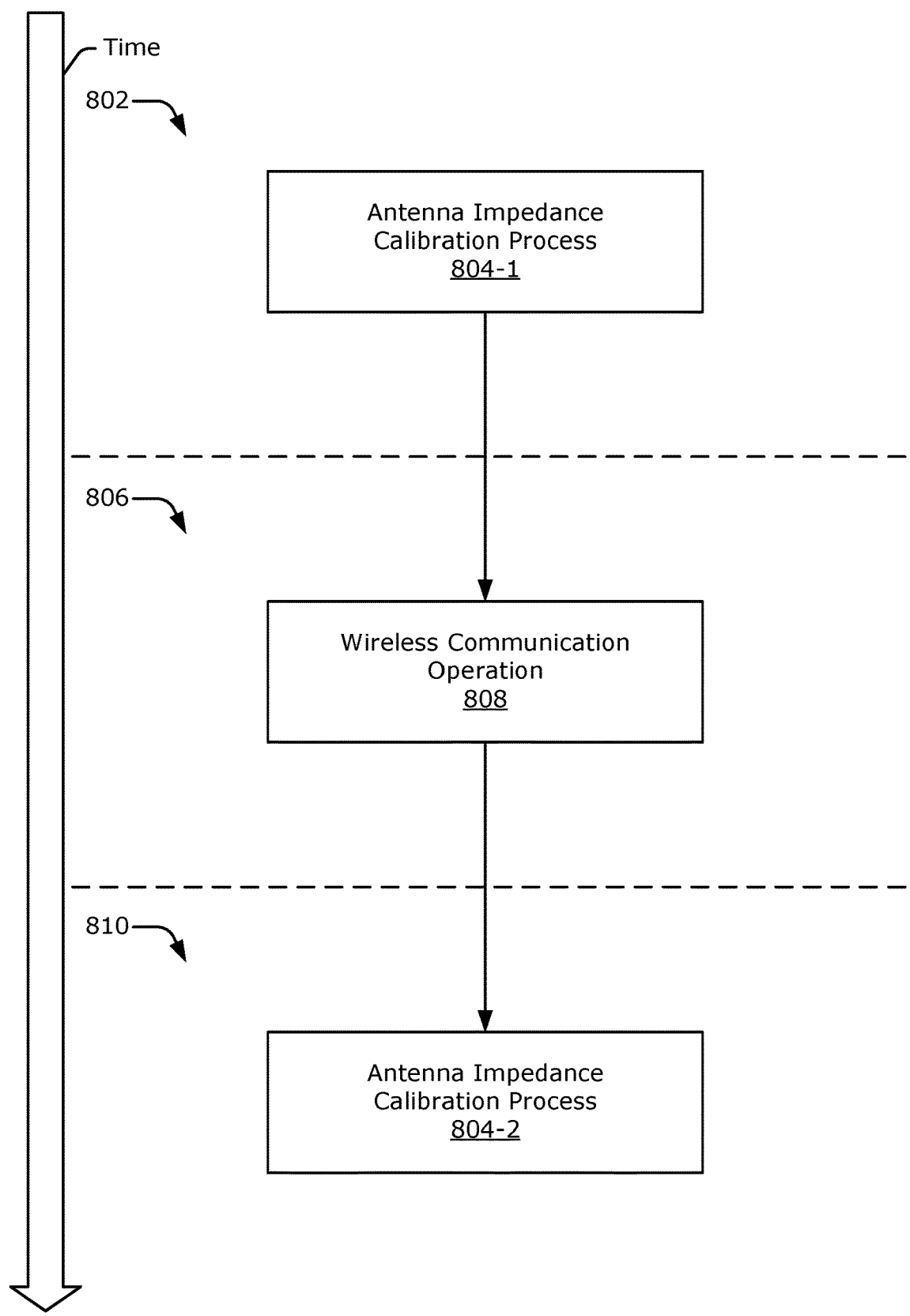
FIG. 8 illustrates an example sequence for performing amplification in the presence of a variable antenna impedance.

FIG. 8 illustrates an example sequence for performing amplification in the presence of a variable antenna impedance, with time elapsing in a downward direction. At 802, an antenna impedance calibration process 804-1 is performed. This process may occur as part of an initialization process of the computing device 102, an initialization process of the wireless transceiver or front-end module 120 (e.g., after power is turned on), or during a test mode. During the antenna impedance calibration process 804-1, the detection circuitry 130 generates the measurement data 224 as described using any of the implementations in FIGS. 4-6. The measurement data 224 is based on a current impedance of the antenna 134 and is indicative of a reflection coefficient or voltage standing wave ratio that is experienced by the balanced power amplifier 122 at this time. Using the measurement data 224, the control circuitry 132 makes appropriate adjustments to the operational states of the power amplifying paths 208-1 and 208-2 to improve performance of the balanced power amplifier 122. For example, if the control circuitry 132 determines that the voltage standing wave ratio is too large (e.g., greater than a reliability threshold such as 10:1), the control circuitry 132 may turn off the balanced power amplifier 122, lower an input power to the balanced power amplifier 122, or lower the supply voltages 308-1 or 308-2 to protect the power amplifiers 304-1 or 304-2. If the voltage standing wave ratio is below the reliability threshold, operations may continue to 806.

At 806, one or more wireless communication operations 808 are performed. These operations may include transmitting uplink signals or receiving downlink signals via the wireless transceiver or the front-end module 120 and the antenna 134. The wireless communication operations 808 can continue for a predetermined amount of time or until the wireless transceiver or the front-end module 120 obtains an indication that the impedance of the antenna 134 may have changed (e.g., by detecting a nearby object or detecting a decrease in power of a downlink signal).

At 810, another antenna impedance calibration process 804-2 occurs. The antenna impedance calibration process 804-2 can occur during available time slots, such as while the wireless transceiver or the front-end module 120 is not transmitting or receiving. Similar to the previous antenna impedance calibration process 804-1, the antenna impedance calibration process 804-2 generates new measurement data 224, which may be used to determine that the impedance of the antenna 134 at 810 differs from the impedance at 802. Based on the new measurement data 224, the antenna impedance calibration process 804-2 makes appropriate adjustments to the operating conditions of the power amplifying paths 208-1 and 208-2. Because the antenna impedance calibration processes 804-1 and 804-2 can occur before wireless communications begin, during available times within the wireless communication operation 808, or between multiple wireless communication operations 808, the balanced power amplifier 122 can be continually adjusted based on variations in the impedance of the antenna 134 without appreciably impacting wireless communication operations.

FIG. 9 is a flow diagram illustrating an example process 900 for performing amplification in the presence of a variable antenna impedance. The process 900 is described in the form of a set of blocks 902-908 that specify operations that can be performed. However, operations are not necessarily limited to the order shown in FIG. 9 or described herein, for the operations may be implemented in alternative orders or in fully or partially overlapping manners. Operations represented by the illustrated blocks of the process 900 may be performed by a wireless transceiver or front-end module 120 (e.g., of FIG. 1 or 2) or a balanced power amplifier 122 (e.g., of FIGS. 1-7). More specifically, the operations of the process 900 may be performed by detection circuitry 130 or control circuitry 132 as shown in FIG. 1 or 2.

At block 902, a first power measurement is performed by detecting a power at an isolated port of a quadrature output power combiner implemented within a balanced power amplifier. The balanced power amplifier includes two power amplifying paths that are respectively coupled to an input port of the quadrature output power combiner and a coupled port of the quadrature output power combiner. For example, the detection circuitry 130 includes the power detector 218-1, which measures the power 410 at the isolated port 216-4 of the quadrature output power combiner 128 as shown in FIG. 4 or 5. The quadrature output power combiner 128 is implemented within the balanced power amplifier 122, which includes two power amplifying paths 208-1 and 208-2 that are respectively coupled to the input port 216-1 and the coupled port 216-3 of the quadrature output power combiner 128. Depending on the implementation, the power 410 can be measured by the power detector 218-1 with the control circuitry 132 disabling the power amplifying path 208-1 and enabling the power amplifying path 208-2 (as described with respect to FIGS. 4 and 5) or with both the power amplifying path 208-1 and 208-2 enabled (as described with respect to FIG. 6).

At block 904, a second measurement and a third measurement are performed within the balanced power amplifier. For example, the detection circuitry 130 can perform the second measurement and the third measurement by detecting other power measurements that are associated with a directional coupler 402 that is implemented within the balanced power amplifier 122. As shown in FIG. 4, these power measurements can include the forward power 406 at the coupled port 404-3 of the directional coupler 402, which is measured by the power detector 218-2, and the reverse power 408 at the isolated port 404-4 of the directional coupler 402, which is measured by the power detector 218-3. Alternatively in FIG. 5, the forward power 406 can be measured using the power detector 218-2 and the detection circuitry 130 can determine the resistance 502 of the resistor 220 that minimizes a difference between the forward power 406 and the power 410. In FIG. 6, the current sensors 602-1 and 602-2 can measure the currents 604-1 or 604-2 within the power amplifying paths 208-1 and 208-2. In general, the first measurement, the second measurement, and the third measurement comprise measurement data 224 that is generated by the detection circuitry 130.

At 906, a magnitude and a sign of a reflection coefficient is determined based on the first measurement, the second measurement, and the third measurement. The control circuitry 132, for example, can use the measurement data 224 to determine the magnitude and the sign of the reflection coefficient. In some implementations, the reflection coefficient may be directly calculated based on the measurement data 224. In other implementations, the control circuitry 132 may reference calibration data or a look-up table to indirectly determine the reflection coefficient based on the measurement data 224. The control circuitry 132 can also determine the voltage standing wave ratio based on the reflection coefficient. Although not explicitly shown, the reflection coefficient or the voltage standing wave ratio can be stored in memory and continually updated by future antenna impedance calibration processes 804.

At 908, operating conditions of the two power amplifying paths are adjusted based on the reflection coefficient. For example, the control circuitry 132 can generate the bias voltage control signal 226, the supply voltage control signal 228, or the operational state control signals 230-1 or 230-2 to adjust the operating conditions of the power amplifiers 304-1 and 304-2 within the power amplifying paths 208-1 and 208-2. The operating condition of each of the power amplifying paths 208-1 and 208-2 can be uniquely customized to account for the load-line modulation. The control circuitry 132 may map the reflection coefficient or the voltage standing wave ratio to target bias voltages 306-1 and 306-2 or target supply voltages 308-1 and 308-2, which enhance performance of the balanced power amplifier 122. The operations described in blocks 902-908 can be repeated such that performance of the balanced power amplifier 122 is continually adjusted to account for variations that can occur in the impedance of the antenna 134.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a balanced power amplifier including:
a first power amplifying path and a second power amplifying path, the first power amplifying path including a first power amplifier, the second power amplifying path including a second power amplifier;
a quadrature output power combiner having an input port, a coupled port, and an isolated port, the input port and the coupled port respectively coupled to the first power amplifying path and the second power amplifying path;
detection circuitry including at least one power detector and a resistor, the resistor coupled between the isolated port and a ground, the at least one power detector coupled to the isolated port, the at least one power detector configured to measure power at the isolated port, the power based on a resistance of the resistor; and
control circuitry coupled to the first power amplifying path, the second power amplifying path, and the detection circuitry, the control circuitry configured to adjust operating conditions of the first power amplifier and the second power amplifier based on the power that is measured at the isolated port.

2. The apparatus of claim 1, further comprising an antenna, wherein:
the balanced power amplifier includes:
an output node coupled to the antenna;
an input node; and
a quadrature input power splitter having another input port coupled to the input node, an output port, and another coupled port;
the first power amplifying path is coupled between the other coupled port of the quadrature input power splitter and the input port of the quadrature output power combiner; and
the second power amplifying path is coupled between the output port of the quadrature input power splitter and the coupled port of the quadrature output power combiner.

3. The apparatus of claim 1, wherein the detection circuitry includes:
a directional coupler having another input port, another coupled port, and another isolated port, the other input port coupled to an output port of the quadrature output power combiner; and
a second power detector of the at least one power detector, the second power detector coupled to the other coupled port of the directional coupler, the second power detector configured to measure a forward power at the other coupled port.

4. The apparatus of claim 3, wherein the detection circuitry includes a third power detector of the at least one power detector, the third power detector coupled to the other isolated port of the directional coupler, the third power detector configured to measure a reverse power at the other isolated port.

5. The apparatus of claim 4, wherein:
the control circuitry is configured to:
enable both the first power amplifying path and the second power amplifying path;
enable the first power amplifying path and disable the second power amplifying path;
enable the second power amplifying path and disable the first power amplifying path; and
adjust the operating conditions based on the power at the isolated port, the forward power at the other coupled port, and the reverse power at the other isolated port; and
the detection circuitry is configured to:
detect the forward power at the other coupled port via the second power detector and the reverse power at the other isolated port via the third power detector with both the first power amplifying path and the second power amplifying path enabled, the forward power and the reverse power indicative of a magnitude of a reflection coefficient; and
detect, via the second power detector, another forward power at the other coupled port with the first power amplifying path enabled and the second power amplifying path disabled and detect, via the at least one power detector, the power at the isolated port with the second power amplifying path enabled and the first power amplifying path disabled, a difference between the other forward power and the power at the isolated port indicative of a sign of the reflection coefficient.

6. The apparatus of claim 3, wherein:
the resistor comprises a variable resistor; and
the detection circuitry is configured to adjust a resistance of the variable resistor.

7. The apparatus of claim 6, wherein:
the control circuitry is configured to:
  enable the first power amplifying path and disable the second power amplifying path;
  enable the second power amplifying path and disable the first power amplifying path; and
  adjust the operating conditions based on the power at the isolated port, the forward power at the other coupled port, and the resistance of the variable resistor; and
the detection circuitry configured to:
  detect, via the second power detector, the forward power at the other coupled port with the first power amplifying path enabled and the second power amplifying path disabled;
  detect, via the at least one power detector, the power at the isolated port with the second power amplifying path enabled and the first power amplifying path disabled; and
  determine the resistance of the variable resistor that minimizes a difference between the power at the isolated port and the forward power; the forward power, the power at the isolated port, and the resistance indicative of a reflection coefficient.

8. The apparatus of claim 1, further comprising a power supply coupled to the first power amplifying path, the second power amplifying path, and the control circuitry, the power supply configured to:
  provide a first supply voltage to the first power amplifier; and
  provide a second supply voltage to the second power amplifier, wherein:
the detection circuitry includes:
a first current sensor coupled between the first supply voltage and an output of the first power amplifier, the first current sensor configured to measure a first current that flows between the first supply voltage and the output of the first power amplifier; and
a second current sensor coupled between the second supply voltage and an output of the second power amplifier, the second current sensor configured to measure a second current that flows between the second supply voltage and the output of the second power amplifier.

9. The apparatus of claim 8, wherein:
the control circuitry is configured to:
  enable both the first power amplifying path and the second power amplifying path;
  enable the first power amplifying path and disable the second power amplifying path;
  enable the second power amplifying path and disable the first power amplifying path; and
  adjust the operating conditions based the power at the isolated port, the first current, and the second current; and
the detection circuitry is configured to:
  detect, via the at least one power detector, the power at the isolated port with the first power amplifying path and the second power amplifying path enabled, the power at the isolated port indicative of a magnitude of a reflection coefficient;
  detect, via the first current sensor, the first current with the first power amplifying path enabled and the second power amplifying path disabled; and
  detect, via the second current sensor, the second current with the second power amplifying path enabled and the first power amplifying path disabled, a difference between the second current and the first current indicative of a sign of the reflection coefficient.

10. The apparatus of claim 1, further comprising bias voltage circuitry coupled to the first power amplifying path, the second power amplifying path, and the control circuitry, the bias voltage circuitry configured to:
  provide a first bias voltage to the first power amplifier; and
  provide a second bias voltage to the second power amplifier,
  wherein the control circuitry is configured to adjust the operating conditions by causing the bias voltage circuitry to adjust both the first bias voltage and the second bias voltage.

11. The apparatus of claim 10, wherein:
the control circuitry is configured to:
  cause the bias voltage circuitry to increase the first bias voltage to a third bias voltage and decrease the second bias voltage to a fourth bias voltage; or
  cause the bias voltage circuitry to decrease the first bias voltage to a fifth bias voltage and increase the second bias voltage to a sixth bias voltage; and
the bias voltage circuitry is configured to:
  provide the third bias voltage or the fifth bias voltage to the first power amplifier after the providing of the first bias voltage; and
  provide the fourth bias voltage or the sixth bias voltage to the second power amplifier after the providing of the second bias voltage.

12. The apparatus of claim 1, further comprising a power supply coupled to the first power amplifying path, the second power amplifying path, and the control circuitry, the power supply configured to:
  provide a first supply voltage to the first power amplifier; and
  provide a second supply voltage to the second power amplifier,
  wherein the control circuitry is configured to adjust the operating conditions by causing the power supply to adjust both the first supply voltage and the second supply voltage.

13. The apparatus of claim 12, wherein:
the control circuitry is configured to:
  cause the power supply to increase the first supply voltage to a third supply voltage and decrease the second supply voltage to a fourth supply voltage; or
  decrease the first supply voltage to a fifth supply voltage and increase the second supply voltage to a sixth supply voltage; and
the power supply is configured to:
  provide the third supply voltage or the fifth supply voltage to the first power amplifier after the providing of the first supply voltage; and
  provide the fourth supply voltage or the sixth supply voltage to the second power amplifier after the providing of the second supply voltage.

14. The apparatus of claim 1, wherein the control circuitry is configured to adjust the operating conditions by performing one of the following:

enable the first power amplifier and enable the second power amplifier;
enable the first power amplifier and disable the second power amplifier;
disable the first power amplifier and enable the second power amplifier; or
disable the first power amplifier and disable the second power amplifier.

15. The apparatus of claim 1, wherein:
the first power amplifying path or the second power amplifying path comprises multiple amplifier stages; and
the first power amplifier or the second power amplifier is associated with a last amplifier stage of the multiple amplifier stages.

16. An apparatus comprising:
an antenna having an impedance; and
a balanced power amplifier including:
    an output node coupled to the antenna;
    a first power amplifying path including a first power amplifier;
    a second power amplifying path including a second power amplifier;
    a quadrature output power combiner having an input port, an output port, a coupled port, and an isolated port, the input port and the coupled port respectively coupled to the first power amplifying path and the second power amplifying path, the output port coupled to the output node;
    detection means for performing three measurements that are indicative of a reflection coefficient, the reflection coefficient based on the impedance of the antenna, the detection means coupled to the isolated port of the quadrature output power combiner; and
    control means for adjusting operating conditions of the first power amplifier and the second power amplifier based on the reflection coefficient.

17. The apparatus of claim 16, further comprising:
bias voltage circuitry coupled to the first power amplifying path, the second power amplifying path, and the control means, the bias voltage circuitry configured to provide a first bias voltage to the first power amplifier and a second bias voltage to the second power amplifier; and
a power supply coupled to the first power amplifying path, the second power amplifying path, and the control means, the power supply configured to provide a first supply voltage to the first power amplifier and a second supply voltage to the second power amplifier,
wherein the control means comprises at least one of the following:
    bias means for causing the bias voltage circuitry to adjust both the first bias voltage and the second bias voltage;
    supply means for causing the power supply to adjust both the first supply voltage and the second supply voltage; or
    operational means for disabling the first power amplifier or the second power amplifier.

18. The apparatus of claim 16, wherein the detection means comprises power means for measuring power at the isolated port of the quadrature output power combiner, the power being a first measurement of the three measurements.

19. The apparatus of claim 18, wherein the detection means comprises directional means for measuring a forward power and a reverse power, the directional means coupled between the output port of the quadrature output power combiner and the output node, the forward power and the reverse power being a second measurement of the three measurements and a third measurement of the three measurements.

20. The apparatus of claim 18, wherein the detection means comprises:
directional means for measuring a forward power between the output port of the quadrature output power combiner and the output node, the forward power being a second measurement of the three measurements; and
resistive means for detecting a resistance at which a difference between the forward power and the power at the isolated port is minimized, the resistance being a third measurement of the three measurements.

21. The apparatus of claim 18, further comprising a power supply coupled to the first power amplifying path and the second power amplifying path, the power supply configured to provide a first supply voltage to the first power amplifier and a second supply voltage to the second power amplifier,
wherein the detection means comprises current means for sensing a first current between the first supply voltage and an output of the first power amplifier and a second current between the second supply voltage and an output of the second power amplifier, the first current and the second current being a second measurement of the three measurements and a third measurement of the three measurements.

22. An apparatus comprising:
an antenna having an impedance;
bias voltage circuitry configured to provide a first bias voltage and a second bias voltage;
a power supply configured to provide a first supply voltage and a second supply voltage; and
a balanced power amplifier including:
    an output node coupled to the antenna;
    an input node configured to obtain a communication signal;
    a quadrature input power splitter having an input port coupled to the input node, an output port, and a coupled port;
    a quadrature output power combiner having another input port, another output port coupled to the output node, and another coupled port;
    a first power amplifying path coupled between the coupled port of the quadrature input power splitter and the input port of the quadrature output power combiner, the first power amplifying path including a first power amplifier configured to amplify the communication signal using the first bias voltage and the first supply voltage;
    a second power amplifying path coupled between the input port of the quadrature input power splitter and the coupled port of the quadrature output power combiner, the second power amplifying path including a second power amplifier configured to amplify the communication signal using the second bias voltage and the second supply voltage; and
    control circuitry coupled to the bias voltage circuitry and the power supply, the control circuitry configured to:
        cause the bias voltage circuitry to adjust both the first bias voltage and the second bias voltage based on the impedance of the antenna; and
        cause the power supply to adjust both the first supply voltage and the second supply voltage based on the impedance of the antenna.

23. The apparatus of claim 22, wherein the antenna is configured to have the impedance that varies based on at least one of the following:
   a beamforming operation; or
   a proximity of an object to the antenna.

24. The apparatus of claim 22, wherein the balanced power amplifier includes detection circuitry coupled to the control circuitry and an isolated port of the quadrature output power combiner, the detection circuitry configured to determine a magnitude and a sign of a reflection coefficient that is based on the impedance of the antenna.

25. The apparatus of claim 24, wherein the detection circuitry includes:
   a directional coupler coupled between the output port of the quadrature output power combiner and the output node, the directional coupler having an additional coupled port and an additional isolated port; and
   three power detectors respectively coupled to the isolated port of the quadrature output power combiner, the additional coupled port of the directional coupler, and the additional isolated port of the directional coupler, the three power detectors configured to measure respective powers indicative of the reflection coefficient.

26. The apparatus of claim 24, wherein the detection circuitry includes:
   a power detector coupled to the isolated port of the quadrature output power combiner, the power detector configured to measure a power at the isolated port;
   a first current sensor coupled between the first supply voltage and an output of the first power amplifier, the first current sensor configured to measure a first current; and
   a second current sensor coupled between the second supply voltage and an output of the second power amplifier, the second current sensor configured to measure a second current, the power, the first current, and the second current indicative of the reflection coefficient.

27. A method for amplification in presence of a variable antenna impedance, the method comprising:
   performing a first power measurement by detecting a power at an isolated port of a quadrature output power combiner implemented within a balanced power amplifier, the balanced power amplifier including two power amplifying paths respectively coupled to an input port of the quadrature output power combiner and a coupled port of the quadrature output power combiner;
   performing a second measurement and a third measurement within the balanced power amplifier;
   determining a magnitude and a sign of a reflection coefficient based on the first measurement, the second measurement, and the third measurement; and
   adjusting operating conditions of the two power amplifying paths based on the reflection coefficient.

28. The method of claim 27, further comprising determining a voltage standing wave ratio based on the reflection coefficient,
   wherein the adjusting of the operating conditions comprises at least one of the following:
      disabling at least one power amplifying path of the two power amplifying paths based on the voltage standing wave ratio exceeding a reliability threshold associated with the power amplifying path;
      adjusting respective supply voltages of the two power amplifying paths to improve power efficiency of the balanced power amplifier based on the voltage standing wave ratio; or
      adjusting respective bias voltages of the two power amplifying paths to improve linearity of the balanced power amplifier based on the voltage standing wave ratio.

29. The method of claim 27, wherein the performing of the first measurement, the performing of the second measurement and the third measurement, the determining of the reflection coefficient, and the adjusting of the operating conditions comprises an antenna impedance calibration process; and
   the method comprises performing another antenna impedance calibration process to dynamically adjust the operating conditions of the two power amplifying path as the reflection coefficient varies.

30. The method of claim 27, wherein the performing of the second measurement and the third measurement comprises at least one of the following:
   detecting respective powers at a coupled port of a directional coupler and at another isolated port of the directional coupler, the directional coupler coupled to an output port of the quadrature output power combiner;
   detecting a forward power at the coupled port of the directional coupler and determining a resistance at the isolated port that minimizes a difference between the power at the isolated port and the forward power; or
   detecting respective currents within the two power amplifying paths.

* * * * *